(12) United States Patent
Hayashi et al.

(10) Patent No.: US 9,437,416 B2
(45) Date of Patent: Sep. 6, 2016

(54) SUPERCRITICAL DRYING METHOD FOR SEMICONDUCTOR SUBSTRATE

(75) Inventors: Hidekazu Hayashi, Yokohama (JP); Hiroshi Tomita, Yokohama (JP); Yukiko Kitajima, Komatsu (JP); Hisashi Okuchi, Yokohama (JP); Yohei Sato, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 945 days.

(21) Appl. No.: 13/231,956

(22) Filed: Sep. 13, 2011

(65) Prior Publication Data

US 2012/0240426 A1     Sep. 27, 2012

(30) Foreign Application Priority Data

Mar. 25, 2011   (JP) .................................. 2011-068537

(51) Int. Cl.
*F26B 3/00*  (2006.01)
*H01L 21/02*  (2006.01)
*H01L 21/67*  (2006.01)

(52) U.S. Cl.
CPC ... *H01L 21/02101* (2013.01); *H01L 21/02068* (2013.01); *H01L 21/67017* (2013.01); *H01L 21/67034* (2013.01)

(58) Field of Classification Search
CPC .................. H01L 21/02068; H01L 21/67034; H01L 21/67017
USPC .......................................................... 34/351
See application file for complete search history.

(56) References Cited

U.S. PATENT DOCUMENTS

| | | | |
|---|---|---|---|
| 6,764,552 B1* | 7/2004 | Joyce et al. ...................... | 134/3 |
| 7,592,267 B2 | 9/2009 | Ode | |
| 7,789,971 B2 | 9/2010 | Kevwitch | |
| 8,153,533 B2 | 4/2012 | DeYoung et al. | |
| 2004/0020518 A1* | 2/2004 | DeYoung .............. | B08B 7/0021 134/30 |

(Continued)

FOREIGN PATENT DOCUMENTS

| | | |
|---|---|---|
| JP | 9-139374 | 5/1997 |
| JP | 2006-66698 | 3/2006 |

(Continued)

OTHER PUBLICATIONS

National Institute of Standards and Technology, Isopropyl Alcohol, 2011 by the U.S. Secretary of Commerce on behalf of the United States of America, 7 pages.*

(Continued)

*Primary Examiner* — Kenneth Rinehart
*Assistant Examiner* — Bao D Nguyen
(74) *Attorney, Agent, or Firm* — Finnegan, Henderson, Farabow, Garrett & Dunner, L.L.P.

(57) ABSTRACT

According to one embodiment, a supercritical drying method for a semiconductor substrate includes introducing a semiconductor substrate formed with a metal film into a chamber, the surface of the substrate being wet with alcohol, supplying a supercritical fluid of carbon dioxide into the chamber, setting a temperature inside the chamber to a predetermined temperature, to replace the alcohol on the semiconductor substrate with the supercritical fluid, and discharging the supercritical fluid and the alcohol from the chamber while keeping the temperature inside the chamber at the predetermined temperature, to lower a pressure inside the chamber. The predetermined temperature is not lower than 75° C. but lower than a critical temperature of the alcohol.

11 Claims, 4 Drawing Sheets

(56) References Cited

U.S. PATENT DOCUMENTS

| | | | |
|---|---|---|---|
| 2006/0254615 A1* | 11/2006 | Kevwitch | 134/2 |
| 2007/0113866 A1* | 5/2007 | Chovino | G03F 1/82 134/1 |
| 2007/0120222 A1* | 5/2007 | Ode | 257/532 |
| 2010/0071726 A1 | 3/2010 | Wagner et al. | |
| 2010/0072169 A1* | 3/2010 | DeYoung et al. | 216/13 |
| 2010/0126531 A1 | 5/2010 | Ku et al. | |
| 2011/0000507 A1 | 1/2011 | Toshima et al. | |

FOREIGN PATENT DOCUMENTS

| | | |
|---|---|---|
| JP | 2007-149866 | 6/2007 |
| JP | 2010-161165 | 7/2010 |
| WO | WO 2010/036575 A2 | 4/2010 |

OTHER PUBLICATIONS

Office Action issued by the Taiwanese Intellectual Property Office on Dec. 27, 2013, for Taiwanese Patent Application No. 100133291, and English-language translation thereof.

Notification of Reason for Rejection issued by the Japanese Patent Office on Jun. 14, 2013, for Japanese Patent Application No. 2011-068537, and English-language translation thereof.

Sato, "Supercritical Drying Method for Semiconductor Substrate," U.S. Appl. No. 13/052,232, filed Mar. 21, 2011.

Hayashi, "Supercritical Drying Method," U.S. Appl. No. 12/976,593, filed Dec. 22, 2010.

* cited by examiner

US 9,437,416 B2

SUPERCRITICAL DRYING METHOD FOR SEMICONDUCTOR SUBSTRATE

CROSS REFERENCE TO RELATED APPLICATIONS

This application is based upon and claims the benefit of priority from the prior Japanese Patent Application No. 2011-68537, filed on Mar. 25, 2011, the entire contents of which are incorporated herein by reference.

FIELD

Embodiments described herein relate generally to a supercritical drying method for semiconductor substrate.

BACKGROUND

A manufacturing process for a semiconductor device includes a variety of steps such as a lithography step, an etching step and an ion-planting step. After completion of each step and before a shift of the process to the next step, a cleaning step and a drying step are performed for removing impurities and a residue left on a wafer surface so as to clean the wafer surface.

For example, in wafer cleaning treatment after the etching step, a chemical liquid for the cleaning treatment is supplied to the wafer surface, and pure water is then supplied to perform rinsing treatment. After the rinsing treatment, drying treatment is performed in which the pure water left on the wafer surface is removed to dry the wafer.

A known method for performing the drying treatment is, for example, replacing the pure water on the wafer with isopropyl alcohol (IPA) to dry the wafer. However, this method has had a problem of collapse of a pattern formed on the wafer due to surface tension of the liquid during the drying treatment.

In order to solve such a problem, supercritical drying performed with the surface tension being zero has been proposed. For example, inside a chamber, a wafer with its surface wet with IPA is brought into the state of being soaked in carbon dioxide in a supercritical state (supercritical $CO_2$ fluid) so that the IPA on the wafer is dissolved into the supercritical $CO_2$ fluid. Then, the supercritical $CO_2$ fluid with the IPA dissolved therein is gradually discharged from the chamber. Thereafter, a pressure and a temperature inside the chamber are lowered to perform phase transition from the supercritical $CO_2$ fluid to gas, which is then discharged to the outside of the chamber, to dry the wafer.

However, there has been a problem in that, at the time of lowering the pressure inside the chamber to transit the phase of the carbon dioxide from the supercritical state to the gas, the IPA which is left inside the chamber while in the state of being dissolved in the supercritical $CO_2$ fluid is cohered and re-adsorbed onto the wafer, resulting in generation of particles (dried trace). Further, depending on the temperature inside the chamber at the time of the supercritical drying treatment, a metal material constituting an electrode and the like provided on the semiconductor substrate might be etched, thus causing deterioration in electric characteristics of the semiconductor device.

DETAILED DESCRIPTION

Embodiments will now be explained with reference to the accompanying drawings.

According to one embodiment, a supercritical drying method for a semiconductor substrate includes introducing a semiconductor substrate formed with a metal film into a chamber, the surface of the substrate being wet with alcohol, supplying a supercritical fluid of carbon dioxide into the chamber, setting a temperature inside the chamber to a predetermined temperature, to replace the alcohol on the semiconductor substrate with the supercritical fluid, and discharging the supercritical fluid and the alcohol from the chamber while keeping the temperature inside the chamber at the predetermined temperature, to lower a pressure inside the chamber. The predetermined temperature is not lower than 75° C. but lower than a critical temperature of the alcohol.

Figure 1:
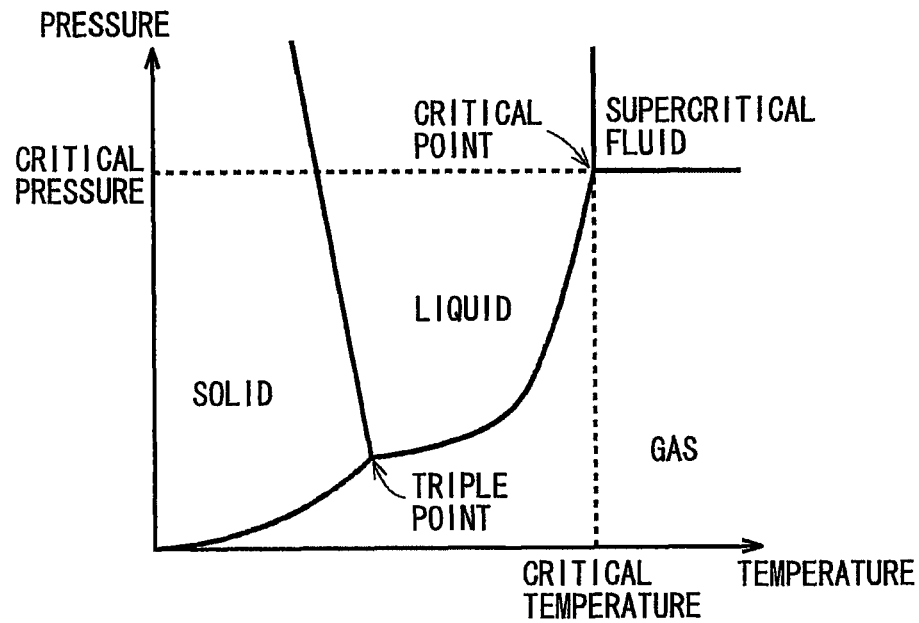
FIG. 1 is a state diagram showing a relation among a pressure, a temperature and a phase state of matter.

First, supercritical drying will be described. FIG. 1 is a state diagram showing a relation among a pressure, a temperature and a phase state of matter. Functional matter of a supercritical fluid used in the supercritical drying has three states of being a gaseous phase (gas), a liquid phase (liquid) and a solid phase (solid), which are referred to as three states of matter.

As shown in FIG. 1, the above three phases are separated by a vapor pressure curve (gas-phase equilibrium line) indicating a boundary between the gaseous phase and the liquid phase, a sublimation curve indicating a boundary between the gaseous phase and the solid phase, and a dissolution curve indicating a boundary between the solid phase and the liquid phase. A point at which these three phases overlap is a triple point. When the vapor pressure curve extends from this triple point to the high temperature and high pressure side, it reaches a critical point as a limit for coexistence of the gaseous phase and the liquid phase. At this critical point, densities of the gaseous phase and the liquid phase are equivalent to each other, and an interface in the gas-liquid coexistent state disappears.

In the state of a temperature and a pressure being higher than those at the critical point, a distinction between the gaseous phase and the liquid phase is nonexistent, and the matter is a supercritical fluid. The supercritical fluid is a fluid compressed to have a high density at a temperature not lower than a critical temperature. The supercritical fluid is similar to gas in terms of diffusion force of solvent molecules being dominant. On the other hand, the supercritical fluid is similar to liquid in terms of an influence of cohesion force of the molecules being not ignorable, and it thus has a property to dissolve a variety of matter.

Further, the supercritical fluid has a very high infiltration property as compared with the liquid, having characteristics of easily infiltrating even into a fine structure.

Moreover, by performing drying such that the supercritical fluid transits directly from the supercritical state to the gaseous phase, the interface between the gas and the liquid is made nonexistent, namely capillary force (surface tension) is made nonfunctional, thereby allowing drying without destruction of the fine structure. The supercritical drying refers to drying of the substrate through use of such a supercritical state of the supercritical fluid.

As the supercritical fluid used in this supercritical drying, for example, carbon dioxide, ethanol, methanol, propanol, butanol, methane, ethane, propane, water, ammonia, ethylene, fluoromethane, or the like is selected.

In particular, carbon dioxide can be treated with ease since it has a critical temperature of 31.1° C. and a critical pressure of 7.37 MPa which are relatively low temperature and low pressure. The supercritical drying treatment according to the present embodiment is a treatment using carbon dioxide.

Figure 2:
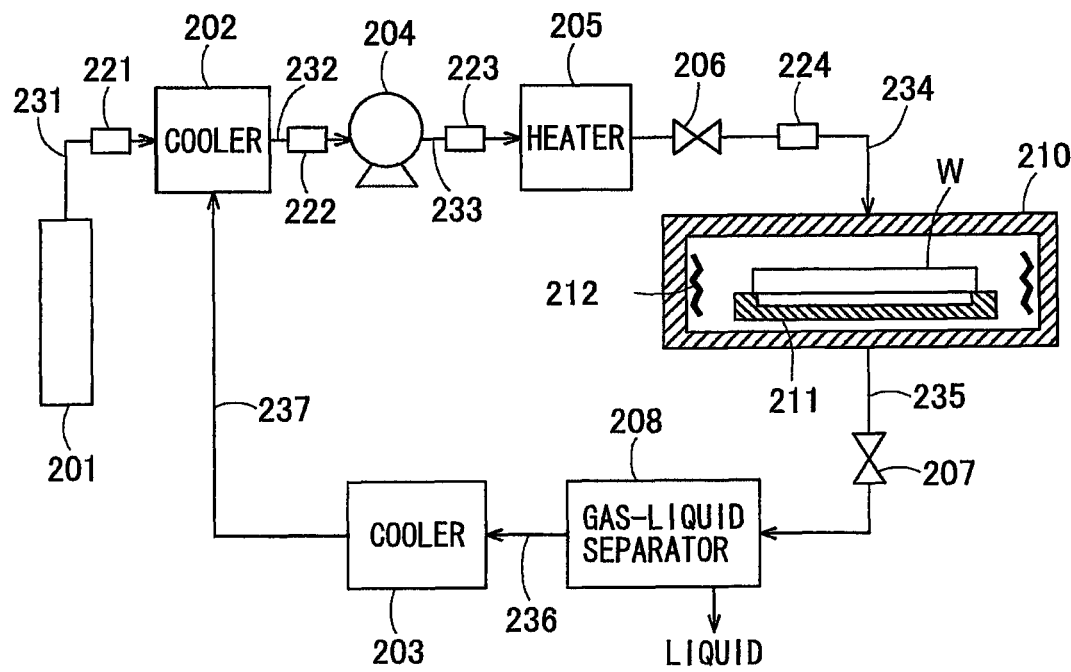
FIG. 2 is a schematic constitutional view of a supercritical drying system according to an embodiment of the present invention.

FIG. 2 shows a schematic configuration of a supercritical drying system according to an embodiment of the present invention. The supercritical drying system is provided with a cylinder 201, coolers 202, 203, a boost pump 204, a heater 205, valves 206, 207, a gas-liquid separator 208, and a chamber 210.

The cylinder 201 stores carbon dioxide in a liquid state. The boost pump 204 sucks out the carbon dioxide from the cylinder 201, raises a pressure thereof, and discharges the carbon dioxide. The carbon dioxide sucked out from the cylinder 201 is supplied to the cooler 202 through a tube 231, cooled therein, and then supplied to the boost pump 204 through a tube 232.

The boost pump 204 raises the pressure of the carbon dioxide, and discharges the carbon dioxide. The carbon dioxide discharged from the boost pump 204 is supplied to the heater 205 through a tube 233. The heater 205 raises a temperature of (heats up) the carbon dioxide to the critical temperature or above.

The carbon dioxide discharged from the heater 205 is supplied to the chamber 210 through a tube 234. The tube 234 is provided with the valve 206. The valve 206 adjusts an amount of carbon dioxide supplied to the chamber 210.

It is to be noted that filters 221 to 224 to remove particles are respectively provided in the tubes 231 to 234.

The chamber 210 is a high-pressure container formed of SUS and ensuring predetermined pressure resistance. Further, the chamber 210 has a stage 211 and a heater 212. The stage 211 is a ring-like flat plate for holding a substrate W to be treated. The heater 212 can adjust a temperature inside the chamber 210. The heater 212 may also be provided on the outer periphery of the chamber 210.

The gas and the supercritical fluid inside the chamber 210 are discharged through a tube 235. The valve 207 is provided in the tube 235. A pressure inside the chamber 210 can be adjusted by means of an opening of the valve 207. The supercritical fluid turns to the gas on the downstream side of the valve 207 in the tube 235.

The gas-liquid separator 208 separates gas and liquid from each other. For example, when the carbon dioxide in the supercritical state with alcohol dissolved therein is discharged, the gas-liquid separator 208 separates the alcohol as a liquid and the carbon dioxide as a gas from each other. The separated alcohol is reusable.

The carbon dioxide in a gaseous state discharged from the gas-liquid separator 208 is supplied to the cooler 203 through a tube 236. The cooler 203 cools the carbon dioxide to bring it into the liquid state, and discharges it to the cooler 202 through a tube 237. The carbon dioxide discharged from the cooler 203 is also supplied to the boost pump 204. With such a configuration formed, carbon dioxide can be used by circulation.

Figure 3:
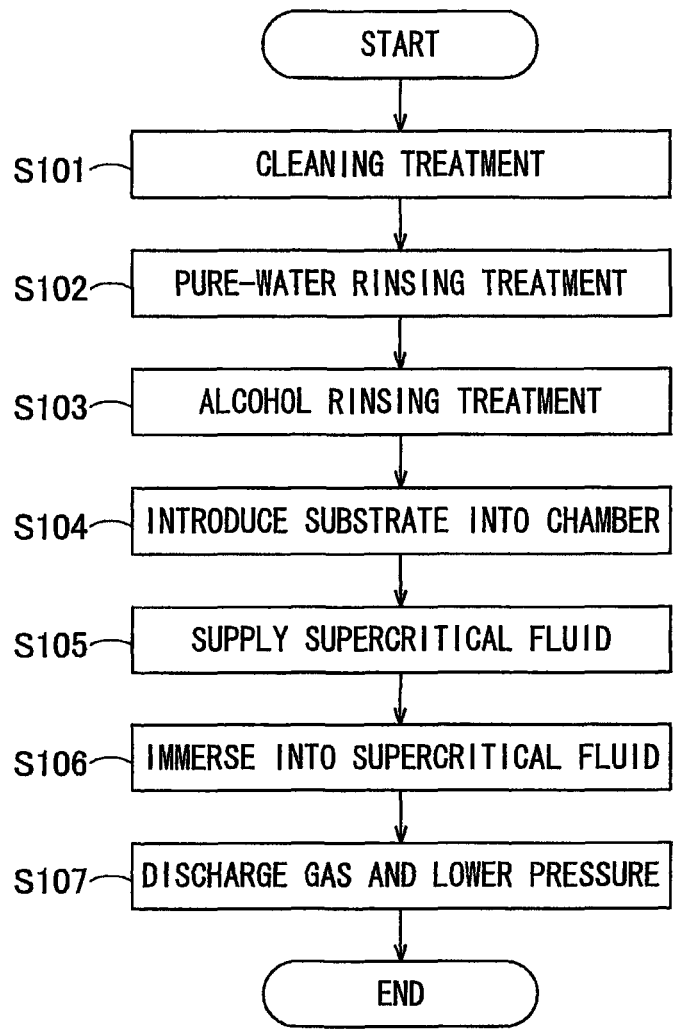
FIG. 3 is a flowchart explaining cleaning and drying methods for a semiconductor substrate according to the embodiment.

FIG. 3 shows a flowchart explaining cleaning and drying methods for a semiconductor substrate according to the present embodiment.

(Step S101)

A semiconductor substrate, as an object to be treated, is brought into a cleaning chamber, not shown. Then, a chemical liquid is supplied to the surface of the semiconductor substrate to perform cleaning treatment. As the chemical liquid, for example, sulfuric acid, hydrofluoric acid, hydrochloric acid, hydrogen peroxide, or the like can be used.

Herein, the cleaning treatment includes treatment to peel off a resist from the semiconductor substrate, treatment to remove particles or metal impurities, treatment to remove by etching a film formed on the substrate, and some other treatment.

In addition, it is assumed that the semiconductor substrate as the object to be treated in the present embodiment is provided with a metal film (metal wiring) formed by use of tungsten.

(Step S102)

Pure-water rinsing treatment is performed, in which pure water is supplied to the surface of the semiconductor substrate and the chemical liquid left on the surface of the semiconductor substrate is rinsed with the pure water.

(Step S103)

Alcohol rinsing treatment is performed, in which alcohol is supplied to the surface of the semiconductor substrate, and the pure water left on the surface of the semiconductor substrate is replaced with the alcohol. As the alcohol used is dissolved in (easily replaces) both pure water and a supercritical carbon dioxide fluid. In the present embodiment, a description will be made using isopropyl alcohol (IPA)

(Step S104)

With the surface kept being wet with the IPA, the semiconductor substrate is taken out of the cleaning chamber so as not to be naturally dried. Then, the substrate is introduced into the chamber 210 of the supercritical drying system shown in FIG. 2, and fixed to the stage 211. After the fixing of the semiconductor substrate, the chamber 210 is tightly sealed.

(Step S105)

The pressure and the temperature of the carbon dioxide gas inside the cylinder 201 are raised by the boost pump 204 and the heater 205, and supplied into the chamber 210 through the tube 234. When the pressure and the temperature inside the chamber 210 are raised to the critical pressure and the critical temperature of the carbon dioxide or above, the carbon dioxide inside the chamber 210 turns to the supercritical fluid (comes into the supercritical state). It should be noted that at this time, using the heater 212, a temperature T inside the chamber 210 is set to a predetermined temperature not lower than 75° C. but lower than the critical temperature (235.6° C.) of the IPA. The reason for setting the temperature T inside the chamber 210 to such a temperature will be described later.

Figure 4:
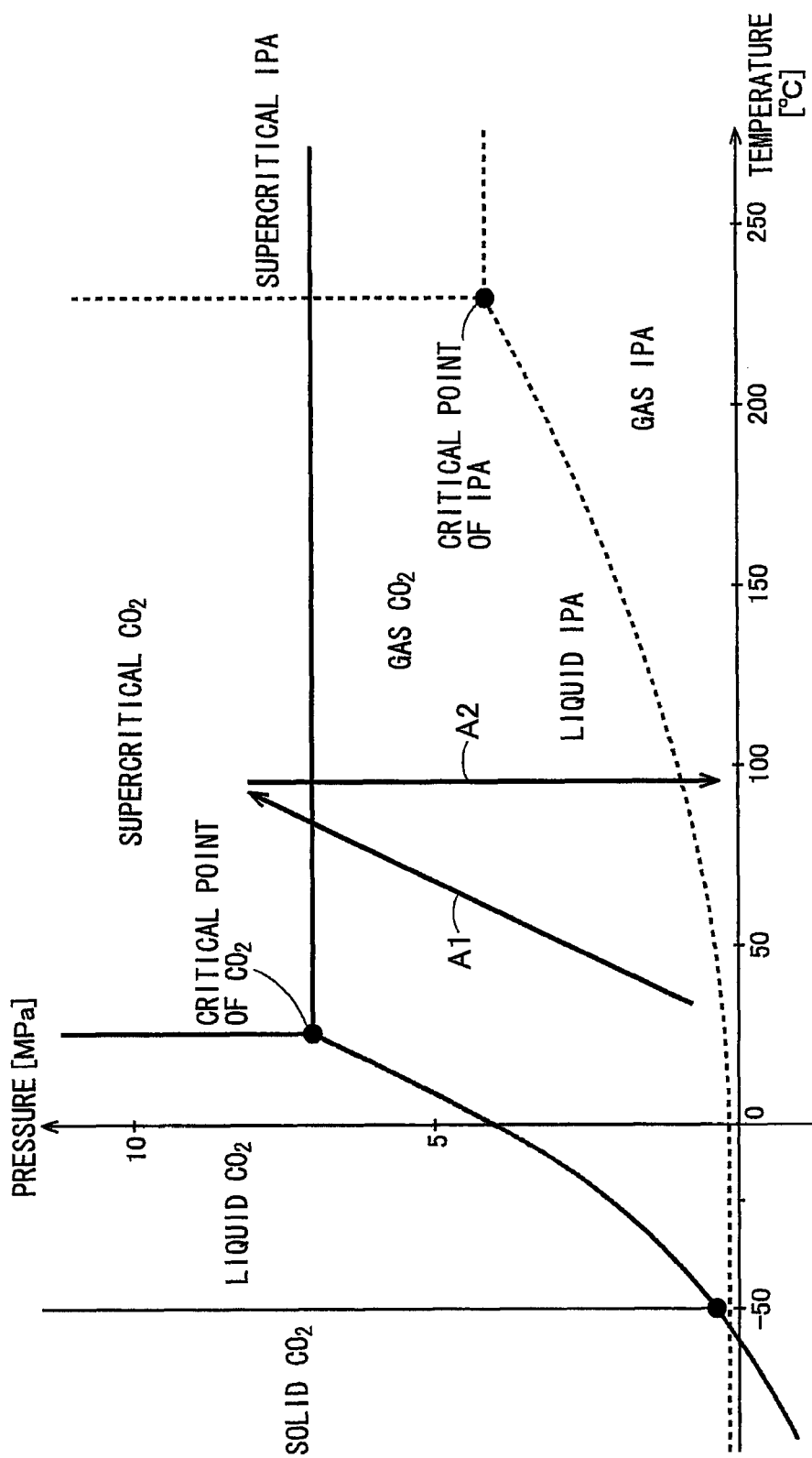
FIG. 4 is a state diagram of carbon dioxide and IPA.

FIG. 4 is a state diagram showing a relation among a pressure, a temperature and a phase state in terms of each of the carbon dioxide and the IPA. In FIG. 4, a solid line corresponds to the carbon dioxide, and a broken line corresponds to the IPA. A change in the carbon dioxide inside the chamber 210 in the present step corresponds to an arrow A1 in FIG. 4.

(Step S106)

The semiconductor substrate is immersed into the supercritical $CO_2$ fluid for a predetermined period of time, for example, on the order of 20 minutes. Thereby, the IPA on the semiconductor substrate is dissolved into the supercritical $CO_2$ fluid, and the IPA is removed from the semiconductor substrate. In other words, the IPA on the semiconductor substrate is replaced with the supercritical $CO_2$ fluid.

At this time, while the supercritical $CO_2$ fluid is supplied into the chamber 210 through the tube 234, the valve 207 is opened so that the supercritical $CO_2$ fluid with the IPA dissolved therein is gradually discharged from the inside of the chamber 210 through the tube 235.

Further, the heater 212 is controlled so as to keep the temperature T inside the chamber 210 at the set temperature in Step S105.

(Step 107)

After the predetermined period of time has elapsed, the valve 207 is opened to discharge the gas, and the pressure inside the chamber 210 is lowered back to the atmospheric pressure (see an arrow A2 in FIG. 4), and the drying treatment on the substrate is completed. The heater 212 is controlled so that the temperature inside the chamber 210 at the time of discharging the gas and lowering the pressure is kept at the predetermined temperature in Step S105. As indicated by the arrow A2 in FIG. 4, due to the decrease in pressure inside the chamber 210, the carbon dioxide inside the chamber 210 changes from the supercritical state to the gaseous state, and the IPA changes from the liquid state to the gaseous state.

In addition, the temperature T inside the chamber 210 at the time of lowering the pressure may slightly fluctuate so long as being not lower than 75° C. but lower than the critical temperature (235.6° C.) of the IPA.

The number of particles with a size of not smaller than 40 nm on the semiconductor substrate after the performance of the cleaning and drying treatment as thus described was observed. The observation was made in each of the cases where the temperature T inside the chamber 210 in Step S105 is 40° C., 75° C., and 97° C. It is to be noted that the pressure inside the chamber 210 (partial pressure of the carbon dioxide) was raised so as to be 8 MPa (not smaller than the critical pressure), and the size of the semiconductor substrate was set to 300 mm.

Figure 5:
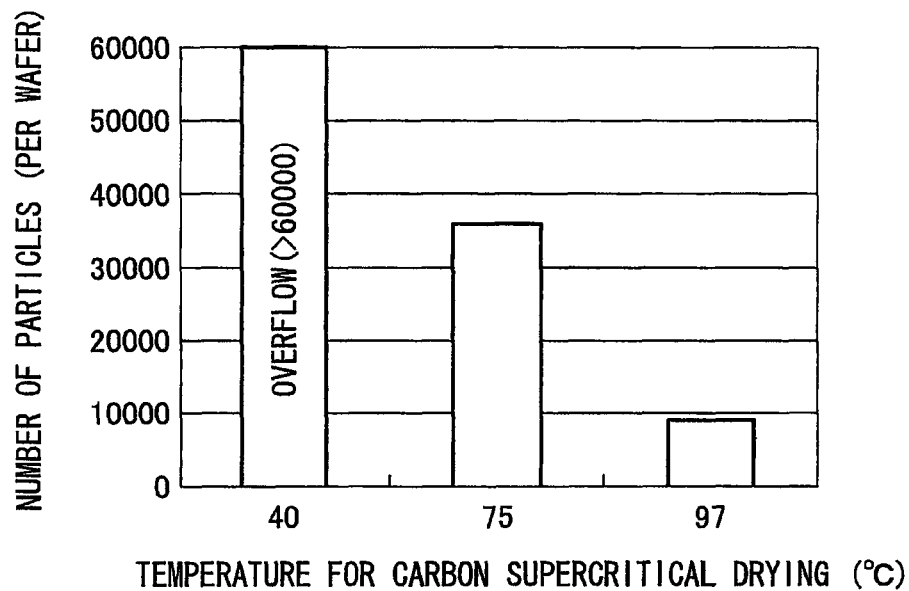
FIG. 5 is a graph showing a relation between a temperature inside a chamber and the number of particles on the semiconductor substrate.

As a result, as shown in FIG. 5, the number of particles on the semiconductor substrate was not smaller than 60000 in the case of the temperature T being 40° C., which was an overflow (not smaller than a set value of a particle measuring device), the number was 35639 in the case of 75° C., and the number was 9279 in the case of 97° C. It is found from this result that increasing the temperature inside the chamber 210 leads to reduction in the number of particles on the semiconductor substrate after the drying treatment. Factors responsible for this reduction are considered to be that a cluster of a solvent (IPA) to be melt into the supercritical $CO_2$ fluid becomes smaller with increase in temperature inside the chamber 210 and particles, attributed to the solvent cohered and falling to the semiconductor substrate, become smaller at the time of discharging the gas and lowering the pressure in Step S107, or even when cohered, the solvent is vaporized before falling onto the semiconductor substrate.

It is better that the number of particles on the semiconductor substrate is smaller. At the temperature of 40° C., a large number of particles are adherent onto the semiconductor substrate, making measurement impossible. Accordingly, the temperature T is made preferably 75° C. and higher (not lower than 75° C.), and more preferably 97° C. and higher (not lower than 97° C.).

Next, an etching rate of a tungsten film on the semiconductor substrate at the time of the cleaning and drying treatment as thus described was observed in each of the cases where the temperature T inside the chamber 210 in Step S105 is 190° C. and 250° C. 190° C. is lower than the critical temperature (235.6° C.) of the IPA, and 250° C. is not lower than the critical temperature of the IPA. The pressure inside the chamber 210 (partial pressure of carbon dioxide) was raised so as to be 8 Mpa.

Figure 6:
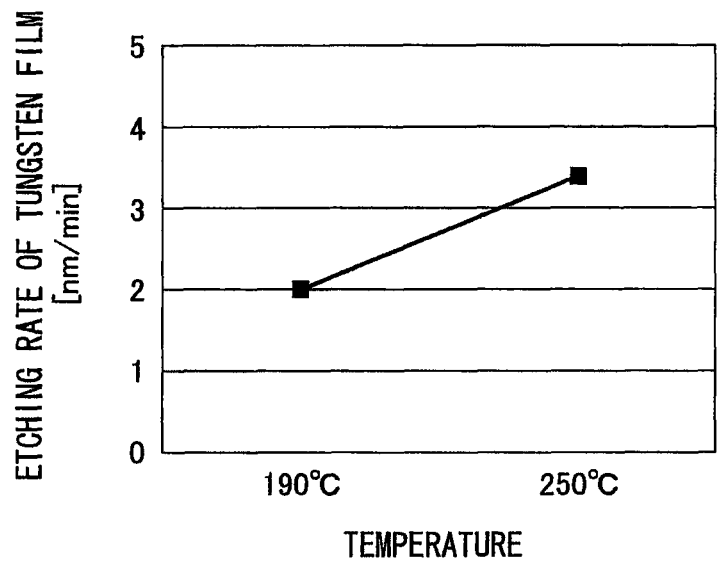
FIG. 6 is a graph showing a relation between the temperature inside the chamber and an etching rate of a tungsten film on the semiconductor substrate.

As a result, as shown in FIG. 6, the etching rate of the tungsten film was about 2 nm/min in the case of the temperature T being 190° C., whereas the etching rate was about 3.4 nm/min in the case of the temperature T being 250° C. It is considered that such result was yield because, when the temperature T was made not lower than the critical temperature of the IPA, the IPA came into the supercritical state to cause generation of a product decomposed from the IPA, and the tungsten film was etched by the product generated with the IPA in the supercritical state. Hence it is preferable to make the temperature T lower than the critical temperature of the IPA.

Accordingly, in consideration of the number of particles and the etching of tungsten on the semiconductor substrate, the heater 212 is controlled, in Step S105, so as to make the temperature T inside the chamber 210 not lower than 75° C., or more preferably not lower than 97° C., but lower than the critical temperature (235.6° C.) of the IPA.

As thus described, according to the present embodiment, the particles generated on the semiconductor substrate can be reduced by making the temperature inside the chamber 210 not lower than 75° C. but lower than the critical temperature (235.6° C.) of the IPA at the time of replacing the IPA on the semiconductor substrate with the supercritical $CO_2$ fluid, discharging the gas and lowering the pressure (Steps S105 to S107). Further, the etching of the tungsten during the drying treatment on the semiconductor substrate can be suppressed so as to prevent deterioration in electrical characteristics of the semiconductor device.

Although the above embodiment was described using the case in which the metal film formed on the semiconductor substrate is the tungsten film, a similar effect can also be obtained even in a case where a metal film of titanium or titanium nitride has been formed.

Further, although the above embodiment was described using the example in which the IPA is used for the alcohol rinsing treatment, ethanol, methanol, fluorinated alcohol or the like may also be used. In that case, the temperature T inside the chamber 210 set in Step S105 is set to lower than a critical temperature of the alcohol used.

Although the supercritical drying system using carbon dioxide by circulation was described in the present embodiment, the configuration of the supercritical drying system is not restricted thereto, and a configuration in which carbon dioxide is not used by circulation may also be formed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A supercritical drying method for a semiconductor substrate, comprising:
   introducing a semiconductor substrate into a chamber;
   supplying a supercritical fluid into the chamber containing the semiconductor substrate and an alcohol;
   setting a temperature inside the chamber to a predetermined temperature not lower than 75° C. but lower than a critical temperature of the alcohol; and
   after supplying the supercritical fluid into the chamber, lowering a pressure inside the chamber while keeping the temperature inside the chamber at a temperature not lower than 75° C. but lower than a critical temperature of the alcohol in a condition where cohered alcohol inside the chamber is vaporized and the supercritical fluid is changed from a supercritical state to a gaseous state inside the chamber.

2. The supercritical drying method for a semiconductor substrate according to claim 1, wherein the predetermined temperature is not lower than 97° C.

3. The supercritical drying method for a semiconductor substrate according to claim 1, wherein
   the semiconductor substrate is cleaned by use of a chemical liquid,
   the semiconductor substrate is rinsed by use of pure water after the cleaning of the semiconductor substrate, and
   the semiconductor substrate is rinsed by use of the alcohol after the rinsing of the semiconductor substrate by use of the pure water and before the introduction of the semiconductor substrate into the chamber.

4. The supercritical drying method for a semiconductor substrate according to claim 3, wherein the substrate includes a metal film, and the metal film contains tungsten, titanium or titanium nitride.

5. The supercritical drying method for a semiconductor substrate according to claim 1, wherein the alcohol is isopropyl alcohol, and the critical temperature is 235.6° C.

6. The supercritical drying method for a semiconductor substrate according to claim 1, wherein the semiconductor substrate is immersed into the supercritical fluid for a predetermined period of time before lowering of the pressure inside the chamber.

7. The supercritical drying method for a semiconductor substrate according to claim 6, wherein the pressure inside the chamber is set to an atmospheric pressure after the predetermined period of time has elapsed.

8. The supercritical drying method for a semiconductor substrate according to claim 1, wherein the semiconductor substrate is formed with a metal film.

9. The supercritical drying method for a semiconductor substrate according to claim 1, wherein the substrate is introduced into the chamber, the surface of the substrate being wet with alcohol.

10. The supercritical drying method for a semiconductor substrate according to claim 1, wherein the supercritical fluid contains carbon dioxide.

11. The supercritical drying method for a semiconductor substrate according to claim 1, wherein the alcohol on the semiconductor substrate is replaced with the supercritical fluid of carbon dioxide.

* * * * *